United States Patent
Yoon et al.

(10) Patent No.: US 6,740,585 B2
(45) Date of Patent: May 25, 2004

(54) BARRIER FORMATION USING NOVEL SPUTTER DEPOSITION METHOD WITH PVD, CVD, OR ALD

(75) Inventors: Ki Hwan Yoon, Sunnyvale, CA (US); Yonghwa Chris Cha, San Jose, CA (US); Sang Ho Yu, Sunnyvale, CA (US); Hafiz Farooq Ahmad, Newark, CA (US); Ho Sun Wee, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/044,412

(22) Filed: Jan. 9, 2002

(65) Prior Publication Data

US 2003/0022487 A1 Jan. 30, 2003

Related U.S. Application Data

(63) Continuation-in-part of application No. 09/916,234, filed on Jul. 25, 2001.

(51) Int. Cl.[7] .............................................. H01L 21/41
(52) U.S. Cl. ...................... 438/680; 438/682; 438/685
(58) Field of Search ......................... 438/680, 682–685; 361/234, 233

(56) References Cited

U.S. PATENT DOCUMENTS

| | | | |
|---|---|---|---|
| 5,122,923 A | 6/1992 | Matsubara et al. | ......... 361/321 |
| 5,252,807 A | 10/1993 | Chizinsky | ................... 219/390 |
| 5,286,296 A | 2/1994 | Sato et al. | .................. 118/719 |
| 5,335,138 A | 8/1994 | Sandhu et al. | ............... 361/303 |
| 5,650,052 A | 7/1997 | Edelstein et al. | ...... 204/192.12 |

(List continued on next page.)

FOREIGN PATENT DOCUMENTS

JP          200195821     *  7/2000

OTHER PUBLICATIONS

Kotaki et al., Novel Oxygen Free Titanium Silicidation-(OFS) Processing For Low Resistance and Termally Stable Salicide (self–sligned silicide) In Deep SubmicronDual Gate CMOS, JAPNDE, ISSN 0021–4922, 1995.*

(List continued on next page.)

*Primary Examiner*—Carl Whitehead, Jr.
*Assistant Examiner*—Yennhu B. Huynh
(74) *Attorney, Agent, or Firm*—Moser, Patterson & Sheridan, LLP

(57) ABSTRACT

Methods and apparatus are provided for forming a metal or metal silicide barrier layer. In one aspect, a method is provided for processing a substrate including positioning a substrate having a silicon material disposed thereon in a substrate processing system, depositing a first metal layer on the substrate surface in a first processing chamber, forming a metal silicide layer by reacting the silicon material and the first metal layer, and depositing a second metal layer in situ on the substrate in a second processing chamber. In another aspect, the method is performed in an apparatus including a load lock chamber, the intermediate substrate transfer region including a first substrate transfer chamber and a second substrate transfer chamber, a physical vapor deposition processing chamber coupled to the first substrate transfer chamber, and a chemical vapor deposition chamber coupled to the second substrate transfer chamber.

39 Claims, 8 Drawing Sheets

U.S. PATENT DOCUMENTS

| | | | |
|---|---|---|---|
| 5,780,361 A | 7/1998 | Inoue | 438/683 |
| 5,814,852 A | 9/1998 | Sandhu et al. | 257/310 |
| 5,838,035 A | 11/1998 | Ramesh | 257/295 |
| 5,851,896 A | 12/1998 | Summerfelt | 438/396 |
| 5,886,864 A * | 3/1999 | Dvorsky | 361/234 |
| 5,899,720 A | 5/1999 | Mikagi | 438/303 |
| 5,902,129 A | 5/1999 | Yoshikawa et al. | 438/592 |
| 5,936,831 A | 8/1999 | Kola et al. | 361/303 |
| 6,033,537 A | 3/2000 | Suguro | 204/192.2 |
| 6,071,055 A | 6/2000 | Tepman | 414/217 |
| 6,165,807 A | 12/2000 | Lee et al. | 438/18 |
| 6,171,922 B1 | 1/2001 | Maghsoudnia | 438/385 |
| 6,179,983 B1 | 1/2001 | Reid et al. | 205/96 |
| 6,218,716 B1 | 4/2001 | Wang et al. | 257/413 |
| 6,221,766 B1 | 4/2001 | Wasserman | 438/656 |
| 6,225,176 B1 | 5/2001 | Yu | 438/305 |
| 6,238,533 B1 | 5/2001 | Satitpunwaycha et al. | 204/298.25 |
| 6,251,759 B1 | 6/2001 | Guo et al. | 438/584 |

OTHER PUBLICATIONS

Byun, et al. "Effect of Deposition Temperature and Sputtering Ambient on In Situ Cobalt Silicide Formation", J. Electrochem. Socl, 144(9) (Sep. 1997), pp. 3175–3179.

Inoue, et al., "A New Cobalt Salicide Technology for 0.15–μm CMOS Devices", *IEEE Transactions on Electron Devices* 45(11) (Nov. 1998), pp. 2312–2318.

USSN 09/748,072 (Narwankan, et al.), filed Dec. 21, 2000.

* cited by examiner

BARRIER FORMATION USING NOVEL SPUTTER DEPOSITION METHOD WITH PVD, CVD, OR ALD

RELATED APPLICATIONS

This application is a continuation-in-part of co-pending U.S. patent application Ser. No. 09/916,234 [AMAT/5547], which was filed on Jul. 25, 2001, and is incorporated by reference herein.

BACKGROUND OF THE INVENTION

1. Field of the Invention

The present invention relates to the fabrication of semiconductor devices and to the apparatus and methods for deposition and annealing of materials on a semiconductor substrate.

2. Description of the Related Art

Recent improvements in circuitry of ultra-large scale integration (ULSI) on semiconductor substrates indicate that future generations of semiconductor devices will require sub-quarter micron multi-level metallization. The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates and die as features decrease below 0.13 $\mu$m in size.

ULSI circuits include metal oxide semiconductor (MOS) devices, such as complementary metal oxide semiconductor (CMOS) field effect transistors (FETs). The transistors can include semiconductor gates disposed between source and drain regions. In the formation of integrated circuit structures, and particularly in the formation of MOS devices using polysilicon gate electrodes, it has become the practice to provide a metal silicide layer over the polysilicon gate electrode, and over the source and drain regions of the silicon substrate, to facilitate lower resistance and improve device performance by electrically connecting the source and drain regions to metal interconnects.

One important processing technique currently used in CMOS processing technology is the Self-Aligned Silicidation (salicide) of refractory metals such as titanium and cobalt. In a salicide process using cobalt (Co), for example, the source and drain and polysilicon gate resistances are reduced by forming a high conductivity overlayer and the contact resistance is reduced by increasing the effective contact area of the source and drain with subsequently formed metal interconnects. Salicide processing technology seeks to exploit the principle that a refractory metal such as cobalt deposited on a patterned silicon substrate will selectively react with exposed silicon under specific processing conditions, and will not react with adjacent materials, such as silicon oxide material.

For example, a layer of cobalt is sputtered onto silicon, typically patterned on a substrate surface, and then subjected to a thermal annealing process to form cobalt silicide (CoSi). Unreacted cobalt, such as cobalt deposited outside the patterned silicon or on a protective layer of silicon oxide, can thereafter be selectively etched away. The selective reaction of cobalt silicide will result in maskless, self-aligned formation of a low-resistivity refractory metal silicide in source, drain, and polysilicon gate regions formed on the substrate surface and in interconnecting conductors of the semiconductor device. After the etch process, further processing of the substrate may occur, such as additional thermal annealing, which may be used to further reduce the sheet resistance of the silicide material and complete formation of cobalt silicide ($CoSi_2$).

However, it has been difficult to integrate cobalt silicide processes into conventional manufacturing equipment. Current processing systems performing cobalt silicide processes require transfer of the substrate between separate chambers for the deposition and annealing process steps. Transfer between chambers may expose the substrate to contamination and potential oxidation of silicon or cobalt deposited on the substrate surface.

Oxide formation on the surface of the substrate can result in increasing the resistance of silicide layers as well reducing the reliability of the overall circuit. For example, oxidation of the deposited cobalt material may result in cobalt agglomeration and irregular growth of the silicide layer. The agglomeration and irregular growth of the cobalt layer may result in device malformation, such as source and drain electrodes having different thicknesses and surface areas. Additionally, excess cobalt silicide growth on substrate surface may form conductive paths between devices, which may result in short circuits and device failure.

One solution to limiting cobalt and silicon contamination has been to sputter a capping film of titanium and/or titanium nitride on the cobalt and silicon film prior to transferring the substrate between processing systems. The capping film is then removed after annealing the substrate and prior to further processing of the substrate. However, the addition of titanium and titanium nitride deposition and removal processes increases the number of processing steps required for silicide formation, thereby reducing process efficiency, increasing processing complexity, and reducing substrate through-put.

ULSI circuits also include the formation of interconnects or contacts between conductive layers, such as the cobalt silicide layer described above and a copper feature. Interconnects or contacts generally comprise a feature definition formed in a dielectric material, such as silicon oxide, a barrier layer deposited on the feature definition, and a metal layer fill or "plug" of the feature definition. Titanium and titanium nitride films have been used as barrier layer material for the metal layer, such as tungsten, and the films are generally deposited by a physical vapor deposition technique. However, deposition of titanium over silicon surfaces presents the problem of titanium silicide formation.

Titanium silicide has been observed to agglomerate, which detrimentally affects subsequently deposited materials. Also, titanium silicide exhibits a radical increase in sheet resistance as feature sizes decrease below 0.17 $\mu$m, which detrimentally affects the conductance of the feature being formed. Further, titanium silicide has an insufficient thermal stability during processing of the substrate at temperatures of about 400° C. or higher, which can result in interlayer diffusion and detrimentally affect device performance.

Additionally, titanium and titanium nitride PVD deposition often occur at extremely low processing pressures, i.e., less than $5 \times 10^{-3}$ Torr, compared with CVD deposition of materials such as tungsten, which may be deposited as high as about 300 Torr. This results in difficult integration of PVD and CVD processes in the same system. This has resulted in many manufactures using separate systems for the PVD titanium and titanium nitride deposition and the CVD tungsten deposition. The increase in the number of systems results in increased production costs, increased production times, and exposes the processed substrate to contamination when transferred between systems.

Therefore, there is a need for a method and apparatus for forming barrier layers and silicide materials on a substrate while reducing processing complexity and improving processing efficiency and throughput.

SUMMARY OF THE INVENTION

Embodiments of the invention described herein generally provide methods and apparatus for forming a metal barrier or a metal silicide layer using a deposition and/or annealing process. In one aspect, a system is provided for processing a substrate including a load lock chamber, an intermediate substrate transfer region comprising a first substrate transfer chamber and a second substrate transfer chamber, wherein the first substrate transfer chamber is operated at a first pressure and the second transfer chamber is operated at a second pressure less than the first pressure and the first transfer chamber is coupled to the load lock chamber and the second substrate transfer chamber is coupled to the first substrate transfer chamber, at least one physical vapor deposition (PVD) processing chamber coupled to the first substrate transfer chamber, at least one chemical vapor deposition (CVD) processing chamber coupled to the second substrate transfer chamber, and at least one annealing chamber coupled to the second substrate transfer chamber.

In another aspect, a method is provided for processing a substrate including positioning a substrate having a silicon material disposed thereon with patterned feature definitions formed therein in a substrate processing system, depositing a first metal layer on the substrate surface in a first processing chamber disposed on the processing system by a physical vapor deposition technique, a chemical vapor deposition technique or an atomic layer deposition technique, forming a metal silicide layer by reacting the silicon material and the first metal layer, and depositing a second metal layer in situ on the substrate in a second processing chamber disposed on the processing system by a chemical vapor deposition technique.

In another aspect, a method is provided for processing a substrate including positioning a substrate having feature definitions formed in a silicon-containing material in a substrate processing system, depositing a metal layer on the silicon-containing material in the feature definitions, wherein the metal layer comprises cobalt, nickel, or combinations thereof, and depositing a tungsten layer on the metal layer by a chemical vapor deposition technique at a temperature sufficient to form a metal silicide layer at an interface of the silicon-containing material and the metal layer.

In another aspect, a method is provided for processing a substrate including positioning a substrate having feature definitions formed in a silicon-containing material in a substrate processing system, depositing a metal layer on the silicon-containing material in the feature definitions in a physical vapor deposition chamber, annealing the substrate in the physical vapor deposition chamber to form a metal silicide layer at an interface of the silicon-containing material and the metal layer, annealing the substrate to substantially convert the metal layer to metal silicide, and depositing a tungsten layer on the metal layer in a chemical vapor deposition chamber.

In another aspect, a method is provided for processing a substrate including positioning a substrate having a silicon material disposed thereon with patterned feature definitions formed therein in a first processing chamber, exposing the substrate to a plasma cleaning process in a first processing chamber, depositing a cobalt layer on the substrate surface and in the feature definitions by a physical vapor deposition technique in a second processing chamber, annealing the substrate at a first temperature in the second processing chamber to partially form a cobalt silicide layer, annealing the substrate at a second temperature greater than the first temperature in a third processing chamber to substantially form the cobalt silicide layer, and depositing a tungsten layer on the cobalt silicide layer by a chemical vapor deposition technique in a fourth processing chamber, wherein the first, second, third, and fourth processing chamber are disposed on one vacuum processing system.

In another aspect, a method is provided for processing a substrate including positioning a substrate having feature definitions formed in a silicon-containing material in a substrate processing system, depositing a metal layer on the silicon-containing material in the feature definitions, wherein the metal layer comprises cobalt, nickel, or combinations thereof, annealing the substrate at a first temperature to form a metal suicide layer, depositing a tungsten layer on the metal layer by a chemical vapor deposition technique, and annealing the substrate at a second temperature greater than the first temperature.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention described herein provide methods and apparatus for forming a metal silicide layer in a deposition chamber or substrate processing system. One embodiment described below in reference to a physical vapor deposition (PVD) process is provided to illustrate the invention, and should not be construed or interpreted as limiting the scope of the invention. Aspects of the invention may be used to advantage in other processes, such as chemical vapor deposition, in which an anneal is desired for forming metal silicide layers.

Figure 1:
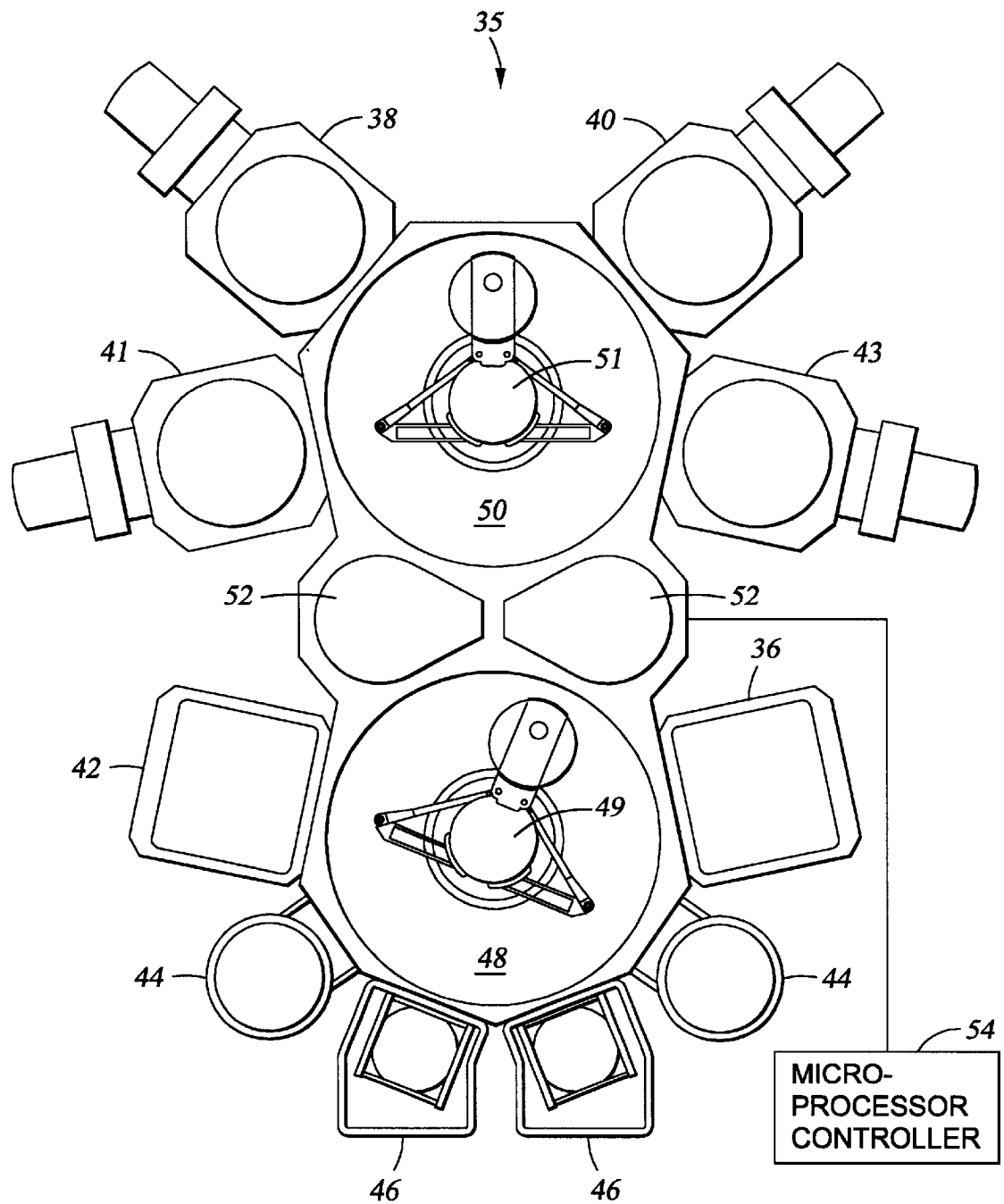
FIG. 1 is schematic top view of one embodiment of an integrated multi-chamber apparatus.

FIG. 1 is shows an integrated multi-chamber substrate processing system suitable for performing at least one embodiment of the physical vapor deposition, the chemical vapor deposition, and annealing processes described herein. The deposition and annealing processes may be performed in a multi-chamber processing system or cluster tool having a PVD chamber and a CVD chamber disposed thereon. One processing platform that may be used to advantage is an Endura™ processing platform commercially available from Applied Materials, Inc., located in Santa Clara, Calif.

FIG. 1 is a schematic top view of one embodiment a processing platform 35 including two transfer chambers 48, 50, transfer robots 49, 51, disposed in transfer chambers 48, 50 respectfully, and a plurality of processing chambers 36, 38, 40, 41, and 42, disposed on the two transfer chambers 48, 50. The first transfer chamber 48 and the second transfer chamber 50 are separated by pass-through chambers 52, which may comprise cooldown or pre-heating chambers. Pass-through chambers 52 also may be pumped down or ventilated during substrate handling when the first transfer chamber 48 and the second transfer chamber 50 operate at different pressures. For example, the first transfer chamber 48 may operate between about 100 milliTorr and about 5 Torr, such as about 400 milliTorr, and the second transfer chamber 50 may operate between about $1 \times 10^{-5}$ Torr and about $1 \times 10^{-8}$ Torr, such as about $1 \times 10^{-7}$. The processing platform 35 is automated by programming a microprocessor controller 54.

The first transfer chamber 48 is coupled with two degas chambers 44, two load lock chambers 46, a reactive pre-clean chamber 42, at least one physical vapor deposition chamber, preferably a long throw physical vapor deposition (PVD) chamber 36, and the pass-through chambers 52. The pre-clean chamber may be a PreClean II chamber, commercially available from Applied Materials, of Santa Clara, Calif. Substrates (not shown) are loaded into the wafer processing system 35 through load-lock chambers 46. Thereafter, the substrates are sequentially degassed and cleaned in degas chambers 44 and the pre-clean chamber 42, respectively. The transfer robot 49 moves the substrate between the degas chambers 44 and the pre-clean chamber 42. The substrate may then be transferred to the long throw PVD chamber 36 for deposition of a material thereon.

The second transfer chamber 50 is coupled to a cluster of process chambers 38, 40, 41, and 43. Chambers 38 and 40 may be chemical vapor deposition (CVD) chambers for depositing materials, such as tungsten, as desired by the operator. An example of a suitable CVD chamber includes WxZ™ chambers, commercially available from Applied Materials, Inc., located in Santa Clara, Calif. The CVD chambers are preferably adapted to deposit materials by atomic layer deposition (ALD) techniques as well as by conventional chemical vapor deposition techniques. Chambers 41 and 43 may be Rapid Thermal Annealing (RTA) chambers, or Rapid Thermal Process (RTP) chambers, that can anneal substrates at vacuum or near vacuum pressures. An example of a RTA chamber 41 is a RADIANCE™ chamber, commercially available from Applied Materials, Inc., Santa Clara, Calif. Alternatively, the chambers 41 and 43 may be WxZ™ deposition chambers capable of performing high temperature CVD deposition, annealing processes, or in situ deposition and annealing processes. The PVD processed substrates are moved from transfer chamber 48 into transfer chamber 50 via pass-through chambers 52. Thereafter, transfer robot 51 moves the substrates between one or more of the process chambers 38, 40, 41, and 43 for material deposition and annealing as required for processing.

RTA chambers (not shown) may also be disposed on the first transfer chamber 48 of the processing platform 35 to provide post deposition annealing processes prior to substrate removal from the platform 35 or transfer to the second transfer chamber 50.

While not shown, a plurality of vacuum pumps is disposed in fluid communication with each transfer chamber and each of the processing chambers to independently regulate pressures in the respective chambers. The pumps may establish a vacuum gradient of increasing pressure across the apparatus from the load lock chamber to the processing chambers.

Alternatively, a plasma etch chamber, such as a Decoupled Plasma Source chamber (DPS™ chamber) manufactured by Applied Materials, Inc., of Santa Clara, Calif., may be coupled to the processing platform 35 or in a separate processing system for etching the substrate surface to remove unreacted metal after PVD metal deposition and/or annealing of the deposited metal. For example in forming cobalt silicide from cobalt and silicon material by an annealing process, the etch chamber may be used to remove unreacted cobalt material from the substrate surface. The invention also contemplates the use of other etch processes and apparatus, such as a wet etch chamber, used in conjunction with the process and apparatus described herein.

Figure 2:
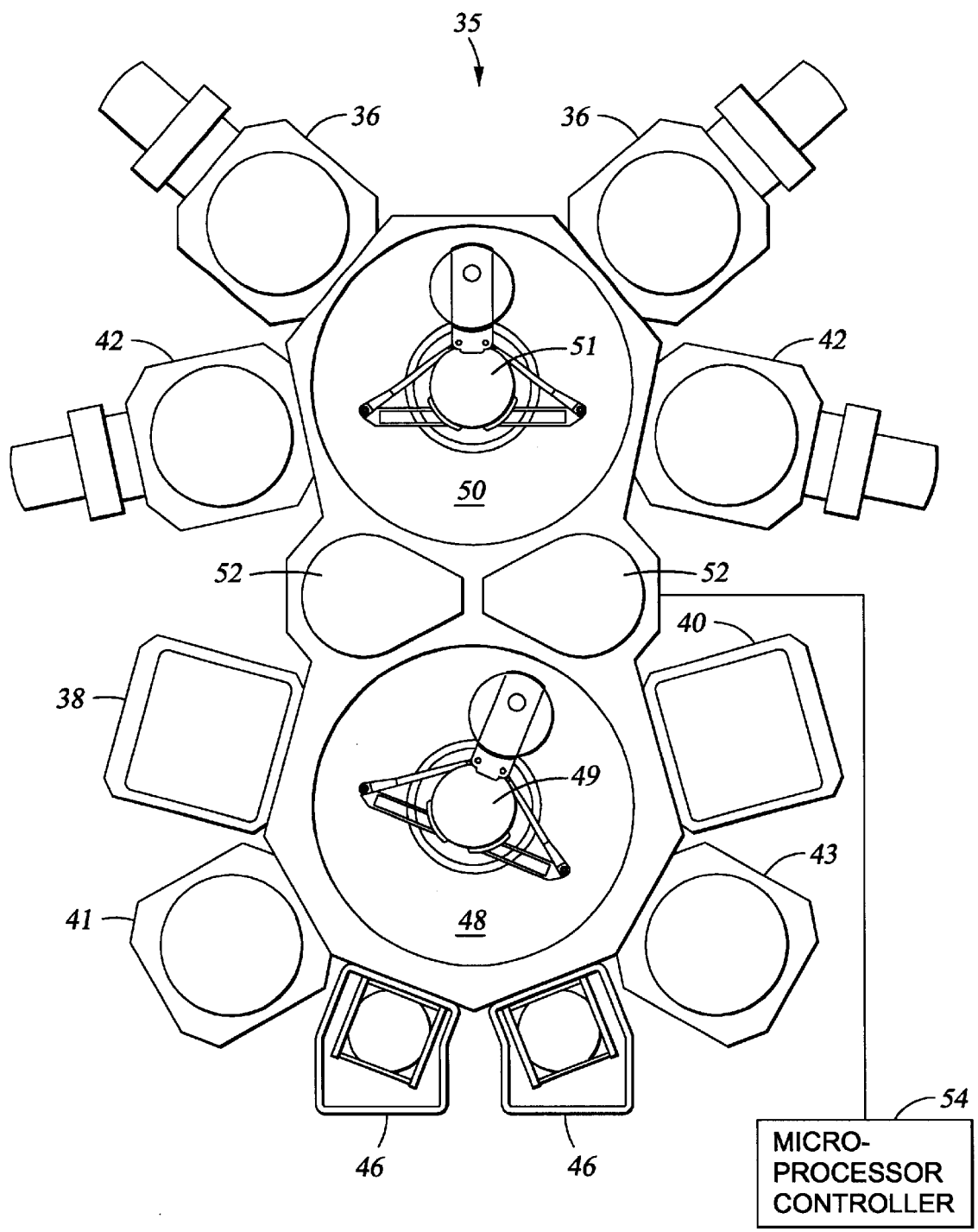
FIG. 2 is schematic top view of another embodiment of an integrated multi-chamber apparatus.

FIG. 2 is a schematic top view of another embodiment of an integrated multi-chamber substrate processing system suitable for performing at least one embodiment the physical vapor deposition, chemical vapor deposition, and annealing processes described herein. In this embodiment, the first transfer chamber 48 is coupled to a cluster of process chambers 38, 40, 41, and 43, two load lock chambers 46, and pass-through chambers 52. Chambers 41 and 43 may be a RTA chambers that can anneal substrates at vacuum or near vacuum pressures, such as the RADIANCE™ chamber, and chambers 38 and 40 are CVD chambers, such as WxZ™ chambers. The first transfer chamber 48 may operate between about $1 \times 10^{-5}$ Torr and about $1 \times 10^{-8}$ Torr, such as about $1 \times 10^{-7}$, and the second transfer chamber 50 may operate between about 100 milliTorr and about 5 Torr, such as about 400 milliTorr.

Alternatively, chambers 41 and 43 may be WxZ™ chambers capable of performing high temperature CVD deposition, annealing processes, or in situ deposition and annealing processes. The pass-through chambers 52 may additionally perform as degas chambers in addition to heating, cooling, and transporting functions.

The second transfer chamber 50 is coupled to reactive pre-clean chambers 42, one or more long throw physical vapor deposition (PVD) chambers 36, and pass-through chambers 52. The second transfer chamber 50 configuration allows for substrate pre-cleaning, such as by a plasma clean method, and PVD deposition at a vacuum pressure of $1 \times 10^{-8}$ prior to transfer to a higher pressure transfer chamber 48. The first transfer configuration allows higher pressure processing, such as annealing, compared to PVD processing, to be performed in the transfer chamber adjacent the loadlocks 46 and prior to substrate removal. The higher pressure first transfer chamber in this embodiment allows for reduced pump down times and reduced equipment costs compared to configuration of system 35 using a near vacuum pressure, such as between about $1\times10^{-5}$ Torr and about $1\times10^{-8}$ Torr, at the first transfer chamber 48.

Figure 3:
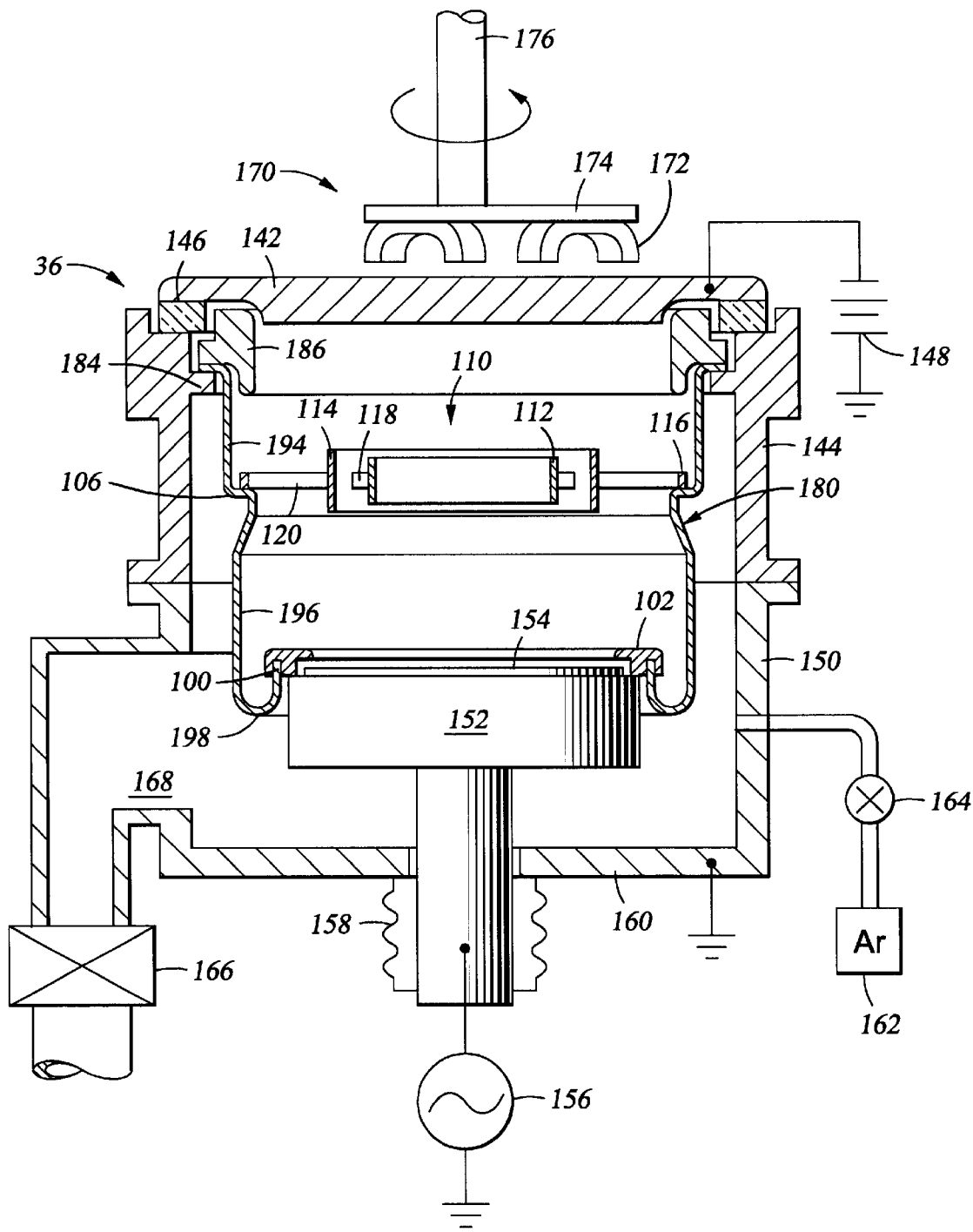
FIG. 3 is a cross-sectional view of one embodiment of a sputtering chamber included within the invention.

FIG. 3 illustrates one embodiment of a long throw physical vapor deposition chamber. Example of suitable long throw PVD chambers are ALPS plus™ and SIP™ PVD processing chambers, both commercially available from Applied Materials, Inc., Santa Clara, Calif.

Generally, the long throw PVD chamber 36 contains a sputtering source, such as a target 142, and a substrate support pedestal 152 for receiving a semiconductor substrate 154 thereon and located within a grounded enclosure wall 150, which may be a chamber wall as shown or a grounded shield.

The chamber 36 includes a target 142 supported on and sealed, as by O-rings (not shown), to a grounded conductive aluminum adapter 144 through a dielectric isolator 146. The target 142 comprises the material to be deposited on the substrate surface during sputtering, and may include cobalt, titanium, tantalum, tungsten, molybdenum, platinum, nickel, iron, niobium, palladium, and combinations thereof, which are used in forming metal silicide layers. For example, elemental cobalt, nickel cobalt alloys, cobalt tungsten alloys, cobalt nickel tungsten alloys, doped cobalt and nickel alloys, or nickel iron alloys may be deposited by using alloy targets or multiple targets in the chamber. The target may also include a bonded composite of a metallic surface layer and a backing plate of a more workable metal.

A pedestal 152 supports a substrate 154 to be sputter coated in planar opposition to the principal face of the target 142. The substrate support pedestal 152 has a planar substrate-receiving surface disposed generally parallel to the sputtering surface of the target 142. The pedestal 152 is vertically movable through a bellows 158 connected to a lower chamber wall 160 to allow the substrate 154 to be transferred onto the pedestal 152 through an load lock valve (not shown) in the lower portion of the chamber and thereafter raised to a deposition position. Processing gas is supplied from a gas source 162 through a mass flow controller 164 into the lower part of the chamber.

A controllable DC power source 148 coupled to the chamber 36 may be used to apply a negative voltage or bias to the target 142. An RF power supply 156 may be connected to the pedestal electrode 152 in order to induce a negative DC self-bias on the substrate 154, but in other applications the pedestal 152 is grounded or left electrically floating.

A rotatable magnetron 170 is positioned in back of the target 142 and includes a plurality of horseshoe magnets 172 supported by a base plate 174 connected to a rotation shaft 176 coincident with the central axis of the chamber 140 and the substrate 154. The horseshoe magnets 172 are arranged in closed pattern typically having a kidney shape. The magnets 142 produce a magnetic field within the chamber, generally parallel and close to the front face of the target 142 to trap electrons and thereby increase the local plasma density, which in turn increases the sputtering rate. The magnets 172 produce an electromagnetic field around the top of the chamber, which magnets are rotated to rotate the electromagnetic field which influences the plasma density of the process to more uniformly sputter the target 142.

Figure 4:
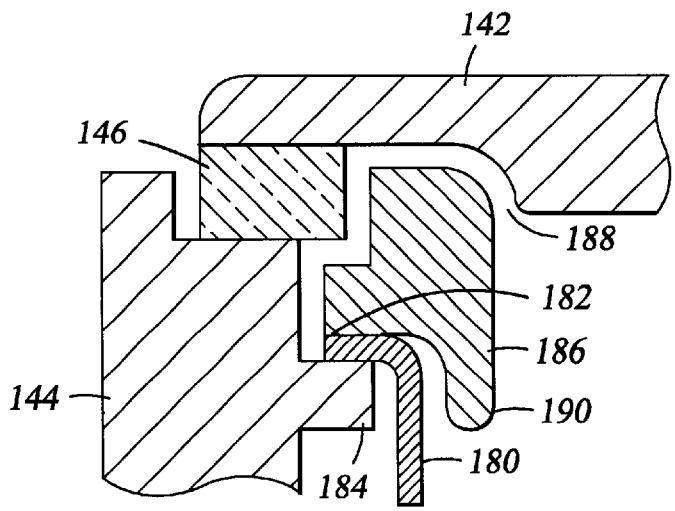
FIG. 4 is an expanded view of FIG. 3 including upper area of the shields near the target.

The chamber 36 of the invention includes a grounded bottom shield 180 having, as is more clearly illustrated in the exploded cross-sectional view of FIG. 4, an upper flange 182 supported on and electrically connected to a ledge 184 of the adapter 144. A dark space shield 186 is supported on the flange 182 of the bottom shield 180, and fasteners (not shown), such as screws recessed in the upper surface of the dark space shield 186 fix it and the flange 182 to the adapter ledge 184 having tapped holes receiving the screws. This metallic threaded connection allows the two shields 180, 186 to be grounded to the adapter 144. The adapter 144 in turn is sealed and grounded to an aluminum chamber sidewall 150. Both shields 180, 186 are typically formed from hard, non-magnetic stainless steel.

A rotatable magnetron 170 is positioned in back of the target 142 and includes a plurality of horseshoe magnets 172 supported by a base plate 174 connected to a rotation shaft 176 coincident with the central axis of the chamber 140 and the substrate 154. The horseshoe magnets 172 are arranged in closed pattern typically having a kidney shape. The magnets 172 produce a magnetic field within the chamber, generally parallel and close to the front face of the target 142 to trap electrons and thereby increase the local plasma density, which in turn increases the sputtering rate. The magnets 172 produce an electromagnetic field around the top of the chamber, which magnets are rotated to rotate the electromagnetic field which influences the plasma density of the process to more uniformly sputter the target 142.

Returning to the overall view of FIG. 3, the bottom shield 180 extends downwardly in a upper generally tubular portion 194 of a first diameter and a lower generally tubular portion 196 of a smaller second diameter to extend generally along the walls of the adapter 144 and the chamber body 150 to below the top surface of the pedestal 152. It also has a bowl-shaped bottom including a radially extending bottom portion 198 and an upwardly extending inner portion 100 just outside of the pedestal 152. A cover ring 102 rests on the top of the upwardly extending inner portion 100 of the bottom shield 180 when the pedestal 152 is in its lower, loading position but rests on the outer periphery of the pedestal 152 when it is in its upper, deposition position to protect the pedestal 152 from sputter deposition. An additional deposition ring (not shown) may be used to shield the periphery of the substrate 154 from deposition.

The chamber 36 may also be adapted to provide a more directional sputtering of material onto a substrate. In one aspect, directional sputtering may be achieved by positioning a collimator 110 between the target 142 and the substrate support pedestal 152 to provide a more uniform and symmetrical flux of deposition material on the substrate 154.

Figure 5:
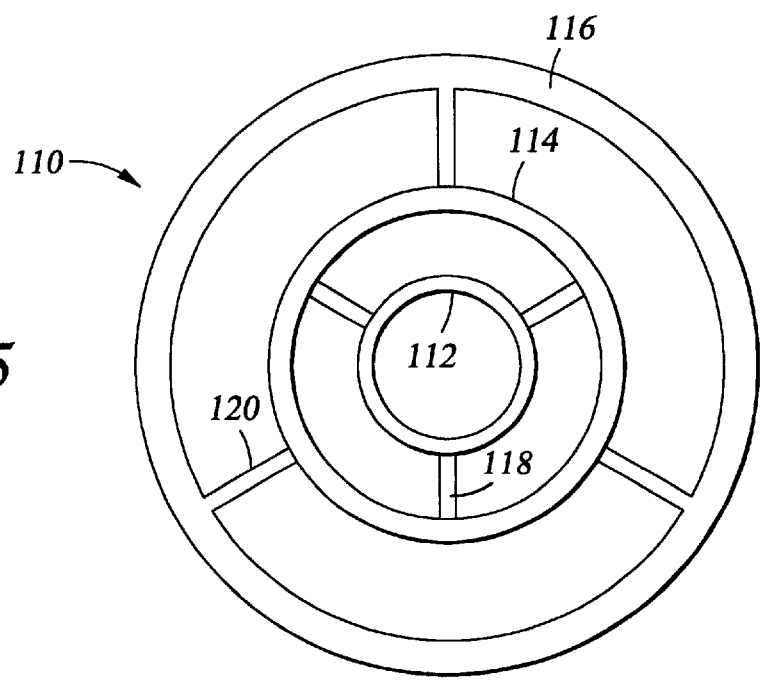
FIG. 5 is a plan view of one embodiment of a ring collimator.

A metallic ring collimator 110, such as the Grounded Ring collimator, rests on the ledge portion 106 of the lower shield, thereby grounding the collimator 110. The ring collimator 110 includes a plurality of concentric tubular sections, for example, three concentric tubular sections 112, 114, 116 linked by cross struts 118, 120 as shown in FIG. 5. The outer tubular section 116 rests on the ledge portion 106 of the lower shield 180. The use of the lower shield 180 to support the collimator 110 simplifies the design and maintenance of the chamber. At least the two inner tubular sections 112, 114 are of sufficient length to define high aspect-ratio apertures that partially collimate the sputtered particles. Further, the upper surface of the collimator 110 acts as a ground plane in opposition to the biased target 142, particularly keeping plasma electrons away from the substrate 154.

Figure 6:
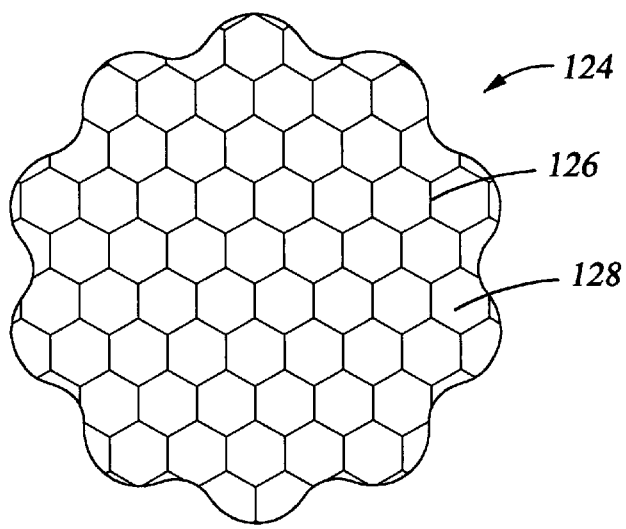
FIG. 6 is a partial plan view of one embodiment of a honeycomb collimator.

Another type of collimator usable with the invention is a honeycomb collimator 124, partially illustrated in the plan view of FIG. 6 having a mesh structure with hexagonal walls 126 separating hexagonal apertures 128 in a close-packed arrangement. An advantage of the honeycomb collimator 124 is, if desired, the thickness of the collimator 124 can be varied from the center to the periphery of the collimator, usually in a convex shape, so that the apertures 128 have aspect ratios that are likewise varying across the collimator 124. The collimator may have one or more convex sides. This allows the sputter flux density to be tailored across the substrate, permitting increased uniformity of deposition. Collimators that may be used in the PVD chamber are described in U.S. Pat. No. 5,650,052, issued Jul. 22, 1997, which is hereby incorporated by reference herein to the extent not inconsistent with aspects of the invention and claims described herein.

Figure 7A:
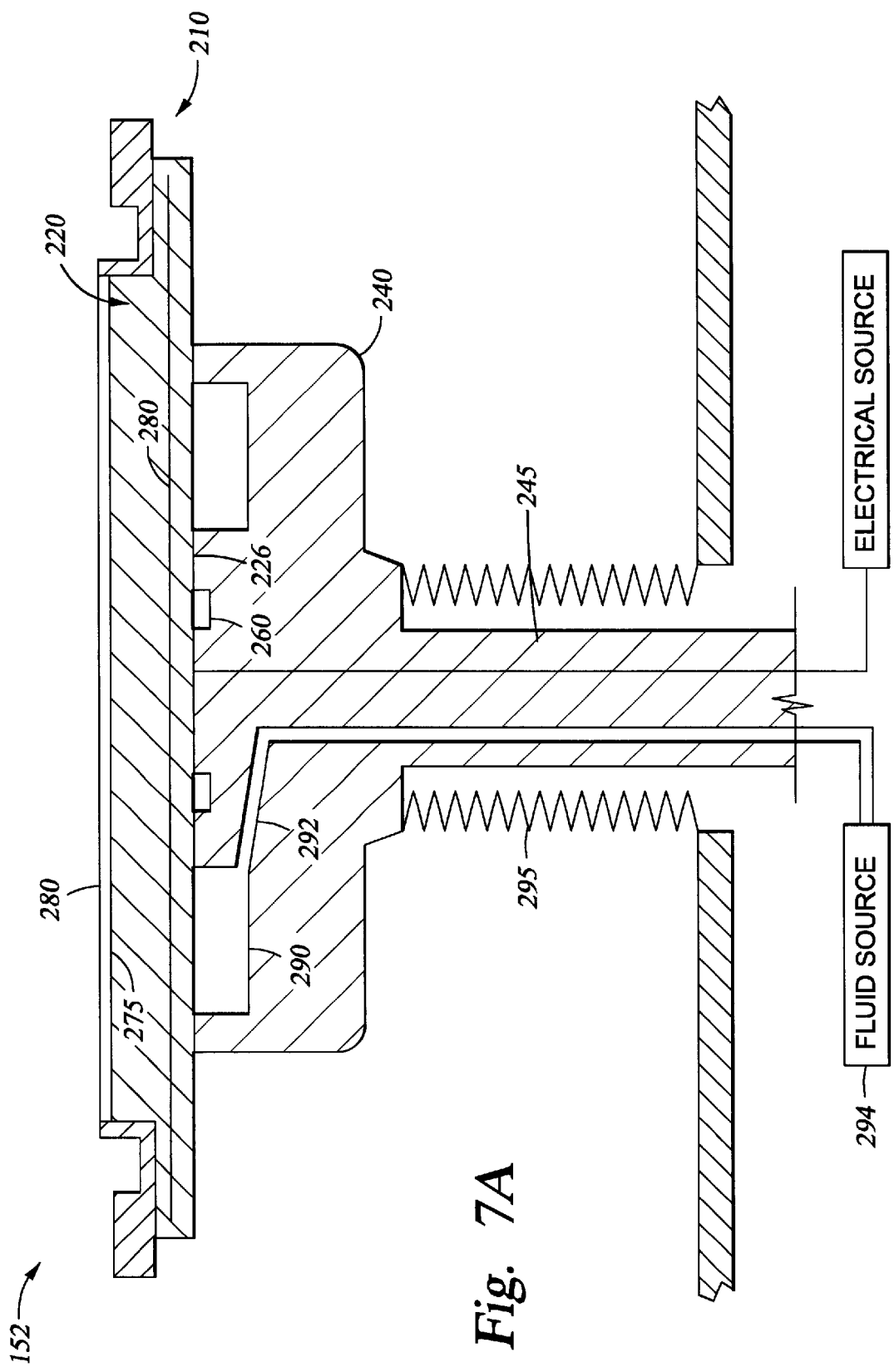
FIG. 7A is a cross-sectional view of one embodiment of a pedestal for annealing a substrate.
Figure 7B:
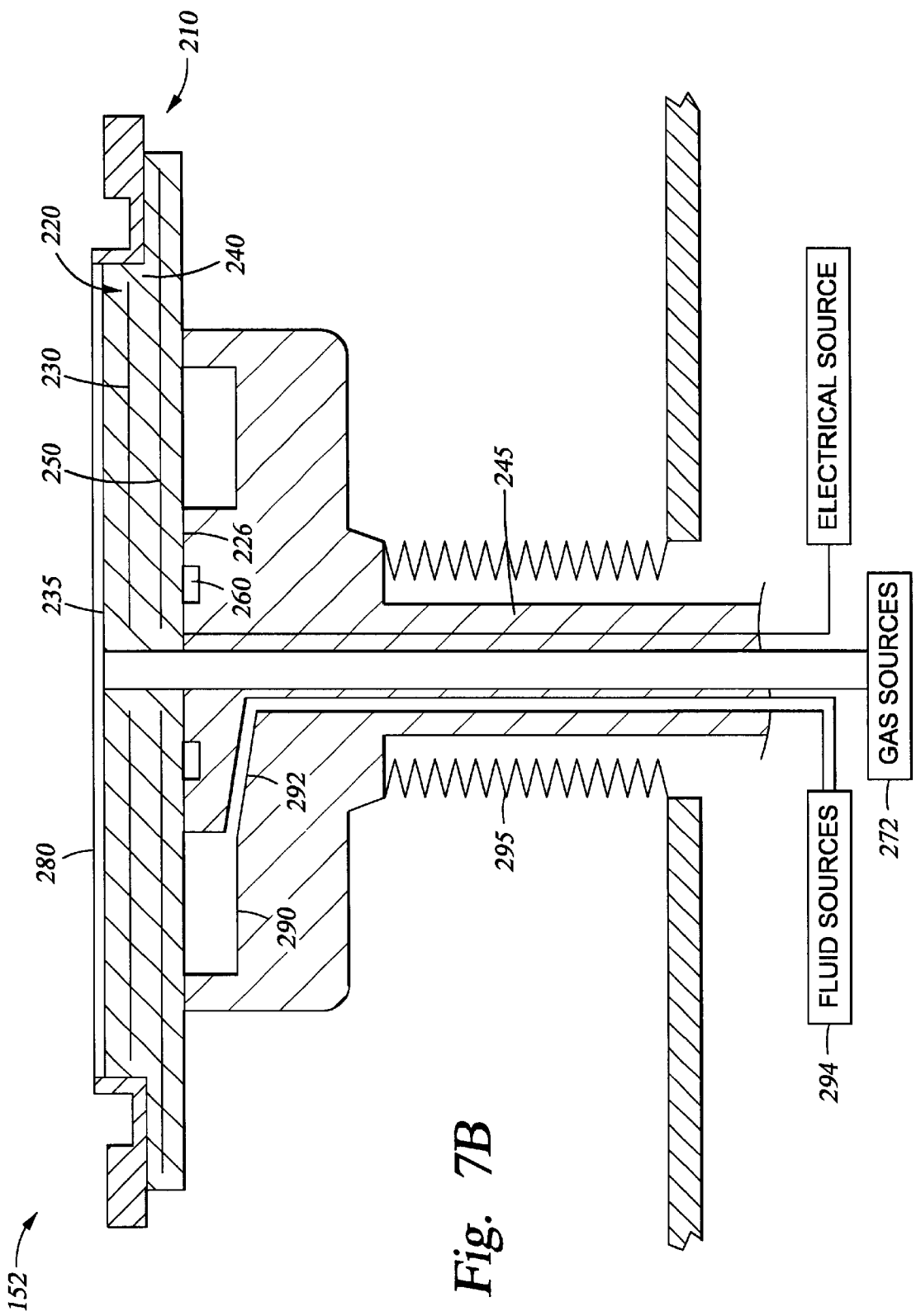
FIG. 7B is a cross-sectional view of another embodiment of a pedestal for annealing a substrate.

One embodiment of a substrate support pedestal 152 is shown in FIG. 7A. The substrate support pedestal 152 is suitable for use in a high temperature high vacuum annealing process. Generally, the substrate support pedestal 152 includes a heating portion 210 disposed on a base 240 coupled to a shaft 245.

The heating portion 210 generally includes heating elements 250 disposed in a thermally conducting material 220 and a substrate support surface 275. The thermally conducting material 220 may be any material that has sufficient thermal conductance at operating temperatures for efficient heat transfer between the heating elements 250 and a substrate support surface 275. An example of the conducting material is steel. The substrate support surface 275 may include a dielectric material and typically includes a substantially planar receiving surface for a substrate 280 disposed thereon.

The heating elements 250 may be resistive heating elements, such as electrically conducting wires having leads embedded within the conducting material 220, and are provided to complete an electrical circuit by which electricity is passed through the conducting material 220. An example of a heating element 250 includes a discrete heating coil disposed in the thermally conducting material 220. Electrical wires connect an electrical source (not shown), such as a voltage source, to the ends of the electrically resistive heating coil to provide energy sufficient to heat the coil. The coil may take any shape that covers the area of the substrate support pedestal 152. More than one coil may be used to provide additional heating capability, if needed.

The fluid channels 290 may be coupled to a surface of the heating portion 210 and may provide for either heating or cooling of the substrate support pedestal 152. The fluid channels 290 may include a concentric ring or series of rings, or other desired configuration, having fluid inlets and outlets for circulating a liquid from a remotely located fluid source 294. The fluid channels 290 are connected to the fluid source 294 by fluid passage 292 formed in the shaft 245 of substrate support pedestal 152. Embodiments of the substrate support pedestal 152 including both heating elements 250 coupled to a power source and fluid channels 290 cooled by a thermal medium passing through fluid conductors connected fluid source, i.e., a liquid heat exchanger generally achieve temperature control of the surface of the substrate support pedestal 152.

Temperature sensors 260, such as a thermocouple, may be attached to or embedded in the substrate support pedestal 152, such as adjacent the heating portion 210, to monitor temperature in a conventional manner. For example, measured temperature may be used in a feedback loop to control electric current applied to the resistive heaters from a power supply, such that substrate temperature can be maintained or controlled at a desired temperature or within a desired temperature range. A control unit (not shown) may be used to receive a signal from temperature sensor and control the heat power supply or a fluid source in response.

The power supply and the fluid supply of the heating and cooling components are generally located external of the chamber 36. The utility passages, including the fluid passage 294, are disposed axially along the base 240 and shaft 245 of the substrate support pedestal 152. A protective, flexible sheath 295 is disposed around the shaft 245 and extends from the substrate support pedestal 152 to the chamber wall (not shown) to prevent contamination between the substrate support pedestal 152 and the inside of the chamber.

The substrate support pedestal 152 may further contain gas channels (not shown) fluidly connecting with the substrate receiving surface 275 of the heating portion 210 to a source of backside gas (not shown). The gas channels define a backside gas passage of a heat transfer gas or masking gas between the heating portion 210 and the substrate 280.

The power supply and the fluid supply of the heating and cooling components are generally located external of the chamber 36. The utility passages, including the fluid passage 292, are disposed axially along the base 240 and shaft 245 of the substrate support pedestal 152. A protective, flexible sheath 295 is disposed around the shaft 245 and extends from the substrate support pedestal 152 to the chamber wall (not shown) to prevent contamination between the substrate support pedestal 152 and the inside of the chamber.

Generally, the electrodes 230 are disposed in the thermally conducting material 220 in a spaced relationship with the heating elements 250 disposed therein. The heating elements 250 are generally disposed in a vertically spaced and parallel manner from the electrodes 230 in the thermally conducting material 220. Typically, the electrodes are disposed between the heating elements and the substrate receiving surface 275 though other configurations may be used.

The embodiments of the substrate support pedestals 152 described above may be used to support a substrate in a high vacuum anneal chamber. The high vacuum anneal chamber may include substrate support pedestals 152 disposed in a PVD chamber, such as the long throw chamber 36 described herein, with a blank target disposed therein or without a target and without bias coupled to either the target or substrate support pedestal.

Embodiments of the substrate support pedestal 152 are described above and are provided for illustrative purposes and should not be construed or interpreted as limiting the scope of the invention. For example, suitable electrostatic chucks that may be used for the support pedestal include MCA™ Electrostatic E-chuck or Pyrolytic Boron Nitride Electrostatic E-Chuck, both available from Applied Materials, Inc., of Santa Clara, Calif.

While the embodiments of substrate support pedestal 152 described herein may be used to anneal the substrate, commercially available anneal chambers, such as rapid thermal anneal (RTA) chambers may also be used to anneal the substrate to form the silicide films. The invention contemplates utilizing a variety of thermal anneal chamber designs, including hot plate designs and heated lamp designs, to enhance the electroplating results. One particular thermal anneal chamber useful for the present invention is the WxZ™ chamber available from Applied materials, Inc., located in Santa Clara, Calif. One particular hot plate thermal anneal chamber useful for the present invention is the RTP XEplus Centura® thermal processing chamber available from Applied Materials, Inc., located in Santa Clara, Calif. One particular lamp anneal chamber is the Radiance™ thermal processing chamber available from Applied Materials, Inc., located in Santa Clara, Calif.

Referring to FIGS. 1 and 2, the processing chambers 36, 38, 40, 41, and 43, are each controlled by a microprocessor controller 54. The microprocessor controller 54 may be one of any form of general purpose computer processor (CPU) that can be used in an industrial setting for controlling process chambers as well as sub-processors. The computer may use any suitable memory, such as random access memory, read only memory, floppy disk drive, hard drive, or any other form of digital storage, local or remote. Various support circuits may be coupled to the CPU for supporting the processor in a conventional manner. Software routines as required may be stored in the memory or executed by a second CPU that is remotely located.

The process sequence routines are executed after the substrate is positioned on the pedestal. The software routines, when executed, transform the general purpose computer into a specific process computer that controls the chamber operation so that a chamber process is performed. Alternatively, the software routines may be performed in hardware, as an application specific integrated circuit or other type of hardware implementation, or a combination of software and hardware.

In operation, the substrate 154 is positioned on the substrate support pedestal 152 and plasma is generated in the chamber 36. A long throw distance of at least about 90 mm separates the target 142 and the substrate. The substrate support pedestal 152 and the target 142 may be separated by a distance between about 100 mm and about 300 mm for a 200 mm substrate. The substrate support pedestal 152 and the target 142 may be separated by a distance between about 150 mm and about 400 mm for a 300 mm substrate. Any separation between the substrate and target that is greater than 50% of the substrate diameter is considered a long throw processing chamber.

The sputtering process is performed by applying a negative voltage typically includes between about between about 0 V and about 2400 V to the target 142 to excite the gas into a plasma state. The D.C. power supply 148 or another power supply may be used to apply a negative bias, for example, between about 0 V and about 700 V, to the substrate support pedestal 152. Ions from the plasma bombard the target 142 to sputter atoms and larger particles onto the substrate 154 disposed below. While, the power supplied is expressed in voltage, power may also be expressed as kilowatts or a power density ($W/cm^2$). The amount of power supplied to the chamber may be varied depending upon the amount of sputtering and the size of the substrate size being processed.

Processing gas used for the sputtering process is introduced into the processing chamber 36 via the mass flow controller 164. The processing gas includes non-reactive or inert species such as argon (Ar), xenon (Xe), helium (He), or combinations thereof. A vacuum pumping system 166 connected through a pumping port 168 in the lower chamber is used to maintain the chamber at a base pressure of less than about $1\times10^{-6}$ Torr, such as about $1\times10^{-8}$ Torr, but the processing pressure within the chamber is typically maintained at between 0.2 milliTorr and 2 milliTorr, preferably less than 1 milliTorr, for cobalt sputtering.

In operation, a substrate is disposed on the substrate support pedestal, and the substrate is heated, with or without the presence of a backside gas, by the heating elements 250 to the desired processing temperature, processed for sufficient time to anneal the substrate for the desired anneal results, and then removed from the chamber. The heating elements 250 of the substrate support pedestal 152 can heat the substrate from room temperature, i.e., about 20° C. to about 900° C. and the fluid channels may cool the substrate to a temperature of about 0° C. The combination of heating elements 250 and the fluid channels 290 are generally used to control the temperature of a substrate 280 between about 10° C. and about 900° C., subject to properties of materials used in substrate support pedestal 152 and the process parameters used for processing a substrate in the chamber 36.

Metal and Metal Silicide Barrier Deposition Processes

Embodiments of the processes described herein relate to depositing metal and metal silicide barrier layers for feature definitions. In one aspect, a first metal layer is deposited on a silicon-containing material and annealed to form a metal silicide layer. A second metal layer is then deposited on the metal silicide layer to fill the feature. The annealing process for to form the metal silicide layer may be performed in multiple annealing steps. The deposition of the first metal layer, the second metal layer, and any required annealing step are preferably performed without breaking vacuum in one vacuum processing system.

The two step annealing process is used to convert the metal layer to a first phase of metal silicide, such as converting cobalt and silicon to a first cobalt silicide (CoSi) phase, or partially convert the metal to a metal silicide. The second annealing step, the metal is substantially converted to the desired silicide phase, such as such as converting the first cobalt silicide (CoSi) phase to a cobalt silicide ($CoSi_2$) product with desired barrier layer properties. Metal silicide is broadly defined herein as a alloy of metal and silicon, which may exist in multiple phases.

The first annealing step may be performed in the same chamber as the deposition chamber, an annealing chamber, such as a vacuum annealing chamber, or during deposition of subsequent materials, such as during a chemical vapor deposition of the second metal. The second annealing step may be performed before or after the deposition of the second metal. The second annealing process generally has a higher annealing temperature than the first annealing temperature.

Preferably, the metal silicide layer may be formed in situ, such as in a deposition chamber or in a processing system without breaking vacuum, prior to or concurrently with depositing a metal layer by a chemical vapor deposition technique. In situ is broadly defined herein as performing two or more processes in the same chamber or in the same processing system without breaking vacuum or transfer to a separate apparatus or system.

For example, in situ annealing may be performed in the same processing chamber as the metal deposition and in situ deposition may performed in a processing chamber adjacent to the deposition chamber, both of which are coupled to a transfer chamber, and the vacuum on the transfer chamber is not broken during processing.

In a further example, in situ processing may be performed on the same processing system at separate processing pressures, such as processing a substrate in processing chambers and annealing chambers disposed on the first and second transfer chambers 48, 50, respectfully, in system 35 without breaking the vacuum on the system 35 or transfer of the substrate to another processing system.

While the following material describes the formation of a metal silicide layer from a cobalt or nickel layer film, the invention contemplates the use of other materials, including titanium, tantalum, tungsten, molybdenum, platinum, iron, niobium, palladium, and combinations thereof, and other alloys including nickel cobalt alloys, cobalt tungsten alloys, cobalt nickel tungsten alloys, doped cobalt and nickel alloys, or nickel iron alloys, to form the metal silicide material as described herein.

Reactive Pre-Clean

Prior to metal deposition on a substrate, the surface of the substrate may be cleaned to remove contaminants, such as oxides formed on exposed. The cleaning process may be performed by a wet etch processes, such as exposure to a hydrofluoric solution, or by a plasma cleaning process, such as exposure to a plasma of an inert gas, a reducing gas, such as hydrogen or ammonia, or combinations thereof. The cleaning process may also be performed prior between processing steps to minimize contamination of the substrate surface during processing.

The plasma clean process may be performed in the PreClean II processing chamber and the RPC+ processing chamber described herein, of which both are commercially available form Applied Materials, Inc., of Santa Clara Calif. In one aspect, the reactive pre-clean process forms radicals from a plasma of one or more gases such as argon, helium, hydrogen, nitrogen, fluorine-containing compounds, and combinations thereof. For example, a pre-clean gas may include a mixture of tetrafluorocarbon ($CF_4$) and oxygen ($O_2$), or a mixture of helium (He) and nitrogen trifluoride ($NF_3$). More preferably, the pre-clean gas is a mixture of helium and nitrogen trifluoride.

The plasma is typically generated by applying a power between about 500 and about 2,000 watts RF at a frequency between about 200 KHz and about 114 MHz. The flow of helium ranges between about 100 and about 500 sccm and the flow of nitrogen trifluoride typically ranges between about 100 sccm and about 500 sccm for 200 mm substrates. The plasma treatment lasts between about 10 and about 150 seconds. Preferably, the plasma is generated in one or more treatment cycles and purged between cycles. For example, four treatment cycles lasting 35 seconds each is effective.

In another aspect, the substrate may be pre-cleaned using an argon plasma first and then a hydrogen plasma. A first pre-clean gas comprising greater than about 50% argon by number of atoms is introduced at a pressure of about 0.8 milliTorr. A plasma of the argon gas is struck to subject the substrate 110 to an argon sputter cleaning environment. The argon plasma is preferably generated by applying between about 50 watts and about 500 watts of RF power. The argon plasma is maintained for between about 10 seconds and about 300 seconds to provide sufficient cleaning time for the deposits that are not readily removed by a reactive hydrogen plasma.

Following the argon plasma, the chamber pressure is increased to about 140 milliTorr, and a second pre-clean gas consisting essentially of hydrogen and helium is introduced into the processing region. Preferably, the processing gas comprises about 5% hydrogen and about 95% helium. The hydrogen plasma is generated by applying between about 50 watts and about 500 watts power. The hydrogen plasma is maintained for about 10 seconds to about 300 seconds.

Metal Deposition

A first metal layer may be deposited on a substrate disposed in chamber 36 as a barrier layer for a second metal layer "plug" or may be deposited and annealed on the substrate pedestal 152 to form the metal silicide layer without breaking vacuum. The substrate includes dielectric materials, such as silicon or silicon oxide materials, disposed thereon and is generally patterned to define features into which metal films may be deposited or metal silicide films will be formed. The first metal layer may be deposited by a physical vapor deposition technique, a chemical vapor deposition technique, or an atomic layer deposition technique.

In another aspect, the substrate may be pre-cleaned using an argon plasma first and then a hydrogen plasma. A first pre-clean gas comprising greater than about 50% argon by number of atoms is introduced at a pressure of about 0.8 milliTorr. A plasma of the argon gas is struck to subject the substrate 154 to an argon sputter cleaning environment. The argon plasma is preferably generated by applying between about 50 watts and about 500 watts of RE power. The argon plasma is maintained for between about 10 seconds and about 300 seconds to provide sufficient cleaning time for the deposits that are not readily removed by a reactive hydrogen plasma.

Plasma is generated by applying a negative voltage to the target 142 between about 0 volts (V) and about −2400 V. For example, negative voltage is applied to the target 142 at between about 0 V and about −1000 V to sputter material on a 200 mm substrate. A negative voltage between about 0 V and about −700 V may be applied to the substrate support pedestal 152 to improve directionality of the sputtered material to the substrate surface. The substrate is maintained at a temperature between about 10° C. and about 600° C. during the deposition process.

An example of a deposition process includes introducing an inert gas, such as argon, into the chamber at a flow rate between about 5 sccm and about 30 sccm, maintaining a chamber pressure between about 0.2 milliTorr and about 1.0 milliTorr, applying a negative bias of between about 0 volts and about 1000 volts to the target 142 to excite the gas into a plasma state, maintaining the substrate at a temperature between about 10° C. and about 600° C., preferably about 50° C. and about 300° C., and most preferably, between about 50° C. and about 100° C. during the sputtering process, and spacing the target between about 100 mm and about 300 mm from the substrate surface for a 200 mm substrate. Cobalt may be deposited on the silicon material at a rate between about 300 Å/min and about 2000 Å/min using this process. A collimator may be used with the process described herein with minimal detrimental affect on deposition rate.

While not shown, the barrier material, such as cobalt or nickel described above, may be deposited by another method using the apparatus shown in FIGS. 1 and 2. The cobalt material may be deposited by a chemical vapor deposition (CVD) technique, an atomic layer deposition (ALD) technique, an ionized magnetic plasma PVD (IMP-PVD) technique, a self-ionized plasma PVD (SIP-PVD) technique or combinations thereof. For example, the cobalt material may be deposited by CVD in a CVD chamber, such as chamber 38 of the processing platform 35 as shown in FIG. 1, or by ALD in a ALD chamber or CVD chamber disposed at position 38, as shown in FIG. 1.

Alternatively, prior to second metal deposition, such as tungsten, a layer of a barrier material, such as titanium or titanium nitride, may be deposited on the first metal layer. The layer of barrier material improves resistance to interlayer diffusion of the second metal layer into the underlying substrate or silicon material. Additionally, the layer of barrier material may improve interlayer adhesion between the first and second metal layers. Suitable barrier layer materials include titanium, titanium nitride, tantalum, tantalum nitride, tungsten nitride, titanium-tungsten alloy, and combinations thereof. The layer of barrier materials may be deposited by a chemical vapor deposition (CVD) technique, an atomic layer deposition (ALD) technique, an ionized magnetic plasma PVD (IMP-PVD) technique, a self-ionized plasma PVD (SIP-PVD) technique or combinations thereof.

Tungsten Deposition

In one aspect, the substrate is then transferred to a chemical vapor deposition chamber for the deposition of a second metal layer, such as tungsten, on the first metal layer, such as cobalt or nickel. Tungsten may be deposited by a chemical vapor deposition (CVD) technique. Tungsten may be deposited at a sufficient temperature, such as between about 300° C. and about 500° C., to initiate the formation of a metal silicide, such as cobalt silicide. The metal silicide may be formed from part or all of the first metal layer.

An annealing step in the processing chamber, such as the WxZ™, capable of annealing processes may be performed in the chamber prior to material deposition. Such an annealing step is performed at a temperature between about 300° C. and about 900° C., such as between about 300° C. and about 400° C. A thin layer or silicon, or "silicon soak" may be deposited on the barrier layer prior to deposition of any tungsten material. The silicon deposition may be performed in situ with the same chemical vapor deposition chamber as the tungsten material deposition. Additionally, a tungsten nucleation step may be performed prior to a main tungsten deposition. The tungsten nucleation step may be performed in situ by an atomic layer deposition (ALD) technique or CVD process in the same chemical vapor deposition chamber as the main tungsten deposition or subsequent tungsten deposition.

An example of a tungsten chemical vapor deposition process includes depositing a silicon layer, also known as a silicon soak layer, a tungsten nucleation layer deposition, and a main, or bulk, tungsten deposition. The silicon layer is deposited by introducing a silane gas (or silane gas derivative) into the chamber at a flow rate between about 50 sccm and about 100 sccm, a reactive gas, such as hydrogen ($H_2$), into the chamber at a flow rate between about 500 sccm and about 5000 sccm, and an inert gas, such as argon or nitrogen, into the chamber at a flow rate between about 500 sccm and about 5000 sccm, maintaining the chamber pressure between about 100 milliTorr and about 300 Torr, and maintaining the substrate temperature between about 300° C. and about 500° C. The process may be performed between about 5 seconds and about 30 seconds. The silicon layer is usually deposited at a thickness of about 1000 Å or less.

The tungsten nucleation layer is deposited by a process including introducing a tungsten precursor gas, such as tungsten hexafluoride ($WF_6$) or derivative thereof, into the chamber at a flow rate between about 5 sccm and about 60 sccm, a silane gas, $SiH_4$, or derivative thereof, into the chamber at a flow rate between about 5 sccm and about 60 sccm, a reactive gas, such as hydrogen ($H_2$), into the chamber at a flow rate between about 500 sccm and about 5000 sccm, and an inert gas, such as argon or nitrogen, into the chamber at a flow rate between about 500 sccm and about 5000 sccm, and maintaining a chamber pressure between about 100 milliTorr and about 300 Torr, and maintaining the substrate temperature between about 300° C. and about 500° C. The process may be performed between about 5 seconds and about 30 seconds. The nucleation layer is usually deposited at a thickness of about 1000 Å or less.

The tungsten layer is then deposited on the tungsten nucleation layer by a process including introducing a tungsten precursor gas, such as tungsten hexafluoride ($WF_6$) or derivative thereof, into the chamber at a flow rate between about 25 sccm and about 250 sccm, a reactive gas, such as hydrogen ($H_2$), into the chamber at a flow rate between about 500 sccm and about 5000 sccm, and an inert gas, such as argon or nitrogen, into the chamber at a flow rate between about 500 sccm and about 5000 sccm, and maintaining a chamber pressure between about 100 milliTorr and about 300 Torr, and maintaining the substrate temperature between about 300° C. and about 900° C. The process may be performed between about 5 seconds and about 300 seconds or until a desired thickness is reached. The deposition rate for tungsten is between about 1000 Å/min and about 3000 Å/min.

The substrate temperature during the main tungsten deposition process is maintained at sufficient temperature, such as, to initiate the formation of a metal silicide layer from silicon material on the substrate and the first metal layer disposed thereon. For example, a substrate temperature between about 300° C. and about 900° C., such as between about 300° C. and about 400° C., may be maintained to form the silicide layer with diffusion barrier properties simultaneously with tungsten deposition.

An example of the tungsten deposition process includes a silicon soak layer formed by introducing a silane gas at a flow rate of about 75 sccm, introducing hydrogen ($H_2$) at a flow rate of about 1000 sccm, introducing argon or nitrogen at a flow rate of about 1500, maintaining the chamber pressure at about 90 Torr, and maintaining the substrate temperature at about 425° C. The process may be performed between about 10 seconds and about 20 seconds. The nucleation layer is deposited by introducing tungsten hexafluoride ($WF_6$) at a flow rate of about 20 sccm, silane gas at a flow of about 10 sccm, hydrogen gas at a flow rate of about 3000 sccm, and argon at a flow rate of about 3000 sccm, and maintaining a chamber pressure at about 30 Torr, and maintaining the substrate temperature at about 425° C. This process may be performed for about 15 seconds. The tungsten layer is deposited by introducing tungsten hexafluoride ($WF_6$) at a flow rate of about 250 sccm, hydrogen gas at a flow rate of about 1000 sccm, and argon at a flow rate of about 3000 sccm, and maintaining a chamber pressure at about 300 Torr, and maintaining the substrate temperature at about 425° C. This process may be performed between about 40 and about 45 seconds.

General In-Situ Annealing Process

Alternatively, the first metal layer may be annealed in situ by one or more annealing steps at annealing temperature between about 300° C. and about 900° C. to form the metal silicide layer prior to the deposition of the second metal layer. The one or more annealing steps may be for between about 10 seconds and about 600 seconds. A selective etch of the first metal layer and metal silicide layer to remove unreacted first metal material may be performed between two or more annealing steps. Deposition of materials, such as a layer of barrier material or the second metal layer, may be performed between two or more annealing steps.

In one example of the annealing process, the substrate may be annealed under an inert gas environment in the deposition chamber by first introducing an inert gas into the chamber at a flow rate between about 0 sccm (i.e., no backside gas) and about 15 sccm, maintaining a chamber pressure of about 2 milliTorr or less, heating the substrate to a temperature between about 300° C. and about 900° C. for between about 5 seconds and about 600 seconds to form the metal silicide layer.

Low Temperature Deposition and Two-Step In-Situ Annealing Process in Two Chambers In another embodiment, the metal layer may be physical vapor deposited on a silicon substrate in chamber 36, annealed at a first temperature for a first period of time, transferred to a second chamber, for example chamber 41, in the system 35, and annealed at a second temperature for a second period of time to form the metal silicide layer without breaking vacuum.

The physical vapor deposition of the metal is performed as described above at a temperature of about 200° C. or less, preferably between about 0° C. and about 100° C. The first step of the two step in situ annealing process described above may be performed under an inert gas environment in the deposition chamber by first introducing an inert gas into the chamber at a flow rate between about 0 sccm and about 15 sccm or less, maintaining a chamber pressure of about 2 milliTorr or less, heating the substrate to a temperature between about 400° C. and about 600° C. for between about 5 seconds and about 300 seconds. Preferably, the substrate is annealed in the deposition chamber at about 500° C. for between about 60 seconds and about 120 seconds. Performing the first annealing the substrate in the same chamber as the deposition process is preferred over other annealing processes described herein.

The substrate is then removed from the deposition chamber and transferred to a vacuum anneal chamber disposed on the same transfer chamber, such as transfer chamber 48 described above in FIG. 1. The high vacuum anneal chamber may include a PVD chamber having a blank target and substrate support pedestal 152 described above or a commercial high vacuum anneal pedestal, such as the High Temperature High Uniformity, HTHU™ substrate support commercially available from Applied Materials Inc., of Santa Clara Calif.

The second annealing step may then be performed by maintaining a chamber pressure of about 2 milliTorr or less and heating the substrate to a temperature between about 600° C. and about 900° C. for a period of time between about 5 seconds and about 300 seconds to form the metal silicide layer. Preferably, the substrate is annealed in the anneal chamber at 800° C. for between about 60 seconds and 120 seconds.

Low Temperature Deposition and Two-Step Anneal Process in Two Chambers

In an alternative embodiment of the two chamber deposition and anneal process, the metal layer is deposited according to the process described herein at about 200° C. or less, preferably between about 0° C. and about 100° C., in the deposition chamber. The substrate is then annealed in the deposition chamber according to the anneal process described above. The substrate may then be transferred to a RTA chamber disposed on transfer chamber 50 in FIG. 1 for a second anneal process.

Annealing in an RTA anneal chamber may be performed by introducing a process gas including nitrogen ($N_2$), argon (Ar), helium (He), and combinations thereof, with less than about 4% hydrogen ($H_2$), at a process gas flow rate greater than 20 liters/min to control the oxygen content to less than 100 ppm, maintaining a chamber pressure of about ambient, and heating the substrate to a temperature between about 600° C. and about 900° C. for between about 5 seconds and about 300 seconds to form the metal silicide layer. Preferably, the substrate is annealed in the RTA anneal chamber at 800° C. for about 30 seconds.

Low Temperature Deposition and Two-Step Annealing Process in Three Chambers.

In another embodiment, the metal layer may be deposited on a silicon substrate in chamber 36, transferred to a first anneal chamber, such as a vacuum anneal chamber disposed on the same transfer chamber 48 on the system 35, annealed for a first temperature for a first period of time, transferred to a second anneal chamber, for example chamber 41, in the system 35, and annealed at a second temperature for a second period of time to form the metal silicide layer without breaking vacuum.

The metal deposition is performed in the deposition chamber according to the process described above at a substrate temperature of about 200° C. or less, preferably between about 0° C. and about 100° C. The first step of this embodiment of the annealing process may be performed in situ in a first high vacuum anneal chamber disposed on a processing system by introducing an inert gas into the anneal chamber at a flow rate of 0 sccm and about 15 sccm, maintaining a chamber pressure about 2 milliTorr or less, heating the substrate to a temperature between about 400° C. and about 600° C. for between about 5 seconds and about 300 seconds. Preferably, the substrate is annealed in the deposition chamber at about 500° C. for between about 60 seconds and about 120 seconds. The first annealing step is believed to form an oxygen resistant film such as CoSi.

The substrate may be annealed in situ by transfer to a second high vacuum annealing chamber in the processing system. The second annealing step may then be performed by maintaining a chamber pressure of about 2 milliTorr or less and heating the substrate to a temperature between about 600° C. and about 900° C. for a period of time between about 5 seconds and about 300 seconds to form the metal silicide layer. Preferably, the substrate is annealed in the anneal chamber at 800° C. for between about 60 seconds and 120 seconds.

Alternatively, the substrate may be transferred to a second annealing chamber located outside the transfer chamber or processing system, such as an atmospheric pressure RTA chamber. Annealing in an RTA anneal chamber may be performed by introducing a process gas including nitrogen ($N_2$), argon (Ar), helium (He), and combinations thereof, with less than about 4% hydrogen ($H_2$), at a process gas flow rate greater than 20 liters/min to control the oxygen content to less than 100 ppm, maintaining a chamber pressure of about ambient, and heating the substrate to a temperature between about 400° C. and about 900° C. for between about 5 seconds and about 300 seconds to form the metal suicide layer. Preferably, the substrate is annealed in the RTA anneal chamber at 800° C. for about 30 seconds.

High Temperature Deposition and Annealing Process.

The metal may be deposited at a high deposition temperature. An example of a deposition process includes introducing an inert gas, such as argon, into the chamber at a flow rate between about 5 sccm and about 30 sccm, maintaining a chamber pressure between about 0.2 milliTorr and about 1.0 milliTorr, applying a negative bias of between about 0 volts and about 1000 volts to the target 142 to excite the gas into a plasma state, maintaining the substrate at about an annealing temperature, i.e., between about 400° C. and about 600° C. by applying a backside gas, and spacing the target between about 100 mm and about 300 mm from the substrate surface for a 200 mm substrate. The temperature may be maintained at about 200° C. by heating the substrate in the absence of a backside gas. Cobalt may be deposited on the silicon material at a rate between about 100 Å/min and about 2000 Å/min using this process.

The annealing process can then be performed in the deposition chamber by ending the plasma and heating of the substrate to a temperature between about 400° C. and 600° C. at the same heating levels used for the deposition process. The annealing process is performed at a temperature between about 400° C. and about 600° C. for between about 5 seconds and about 300 seconds. Preferably, the substrate is annealed in the deposition chamber at about 500° C. for between about 60 seconds and about 120 seconds.

The second annealing step may then be formed in an annealing chamber without breaking vacuum or in an annealing chamber located on a separate transfer chamber or processing system. The second annealing step includes heating the substrate to a temperature between about 600° C. and about 900° C. for a period of time between about 5 seconds and about 300 seconds to form the metal silicide layer. Preferably, the substrate is annealed at 800° C. for between about 60 seconds and 120 seconds.

Interlayer Deposition and Annealing Process.

In one aspect of the invention, the two-step annealing process described herein may be separated by one or more processing steps, such as deposition processes. For example, a first metal layer, such as a cobalt or nickel layer, may be deposited in a first chamber, in situ annealed in the first transfer chamber or transferred to a second chamber for subsequent deposition and annealed therein. A second metal layer, such as tungsten is then deposited on the annealed substrate, and the substrate is exposed to a second anneal in the second chamber or transferred to a third chamber for the completion of the annealing process.

In another example, a first metal layer, such as a cobalt or nickel layer may be deposited in a first chamber, in situ annealed in the processing platform, transferred to a second deposition chamber for deposition of a barrier material thereon, such as titanium nitride, transferred to a third deposition chamber for deposition of a second metal, and then further annealed the third chamber or transferred to a fourth chamber for the completion of the annealing process. Alternatively, the in situ anneal of the first metal layer may be performed after the deposition of the barrier material and prior to the deposition of the second metal layer, such as tungsten, deposition.

Examples of Metal and Metal Silicide Deposition

Figure 8A:
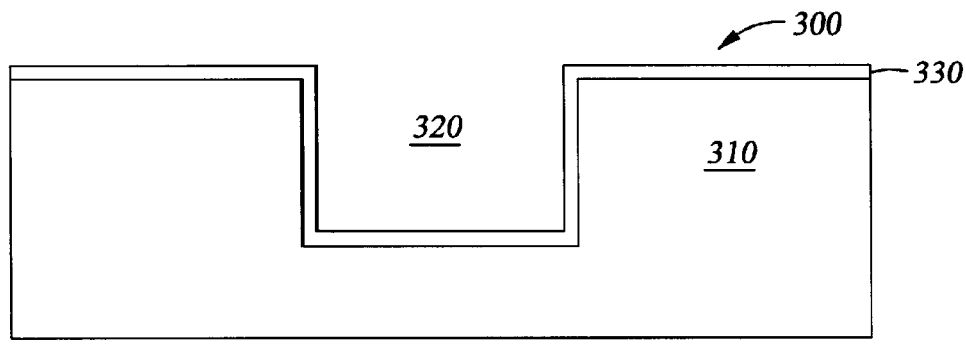
FIGS. 8A–8C are schematic sectional views of one deposition process described herein.
Figure 8B:
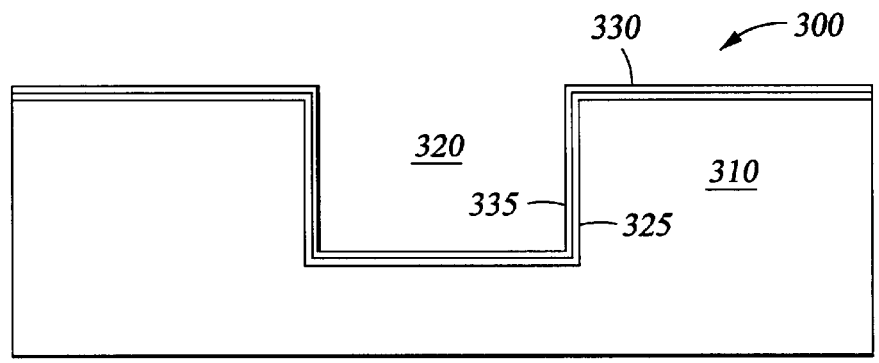

An example of a deposition process of a metal silicide layer as a barrier layer for a tungsten plug in a feature definition is as follows and shown in FIGS. 8A–C. A substrate having a silicon-containing material 310 formed thereon with feature definitions 320 formed therein is provided to the processing system. The silicon-containing material 310 may be a dielectric material including silicon, silicon oxide, a doped silicon or silicon oxide layer, or other silicon-containing dielectric material used in substrate processing, which may be deposited by physical vapor deposition, chemical vapor deposition, or other method known or unknown in the art. The invention also contemplates that layer 310 may include semi-conductive silicon-containing materials including polysilicon, doped polysilicon, or combinations thereof, deposited by methods known or unknown in the art.

Feature definitions 320 are formed in the silicon-containing material 310 by conventional method known in the art. For example, the feature definitions may be formed by depositing and patterning a photoresist material to define the feature openings, a silicon etch process is then used to define the feature definitions, and any remaining photoresist material is removed, such as by an oxygen stripping method. The feature definitions may than be treated with a plasma clean process to remove any contaminants, such as oxide formed on the silicon-containing material, prior to deposition of subsequent materials as described herein. A layer of cobalt is deposited as a barrier layer 330 by the PVD deposition process described herein over the bottom and sidewalls of the feature definitions 320 as shown in FIG. 8A.

The cobalt barrier layer 330 may be annealed to form cobalt silicide at the interface 325 of the cobalt layer and the silicon containing material 310. Depending on the annealing process used, substantially all or only a portion of the cobalt layer 330 may be converted to cobalt silicide. When the cobalt material is not substantially converted to the cobalt silicide material, a surface 335 of unreacted cobalt is formed which is exposed to subsequently deposited materials as shown in FIG. 8B. This cobalt surface 335 may be maintained to further act as additional barrier layer material for subsequent metal deposition, such as tungsten, or may be removed from the substrate 300 surface by an etch process.

Figure 8C:
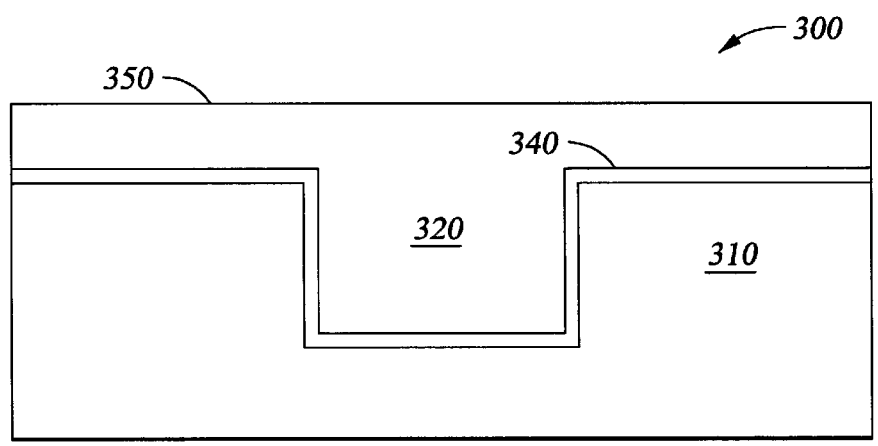

A layer of tungsten 350 is deposited to fill the feature 320 as shown in FIG. 8C. The tungsten deposition may be at a high enough temperature to completely convert the any unreacted cobalt material to cobalt silicide, in effect annealing the cobalt material, while depositing to fill the feature 320. Alternatively, a second annealing step is performed to substantially convert the cobalt layer 330 to a cobalt silicide layer 340.

Such a cobalt silicide barrier and tungsten fill of the feature 320 may be processed in the system 35 as follows. Referring to FIG. 2, the substrate is introduced into the first transfer chamber 48 of the system 35 via the loadlock 46. The first transfer chamber is operating at about 400 milli-Torr. Transfer robot 49 retrieves the substrate from the loadlock 46 and transfer to pass-through chambers 52. Transfer robot 51 in the second transfer chamber 50 retrieves the substrate from the pass-through chamber 52 and positions the substrate in PVD chamber 38 for cobalt deposition. The second transfer chamber is operated at about $1 \times 10^{-8}$ Torr. Alternatively, the transfer robot 51 positions the substrate in one of the pre-clean chambers prior to cobalt deposition in the PVD chamber 38. Following PVD deposition, the substrate is transferred back to the first transfer chamber 48 and disposed in a WxZ™ CVD chamber 38 for CVD tungsten deposition. The substrate may then be annealed as necessary.

Alternatively, following PVD deposition, the substrate is disposed in chamber 41, which is a WxZ™ chamber capable of in situ annealing, where the cobalt material is first annealed to form a silicide material or to improve barrier properties prior to CVD deposition. A layer of tungsten may then be deposited in the WxZ™ chamber following the anneal step. However, the substrate may be transferred after the first anneal in the WxZ™ chamber to a plasma etch chamber, such as a DPS™ chamber, for etching to remove cobalt and then annealed a second time in the WxZ™ chamber or another anneal chamber prior to tungsten deposition. Following deposition, and annealing if necessary, the substrate is transferred to the loadlock chamber 46 via the transfer robot 49. The substrate may then be transferred to a separate apparatus, such as a chemical-mechanical polishing apparatus, for further processing.

Figure 9:
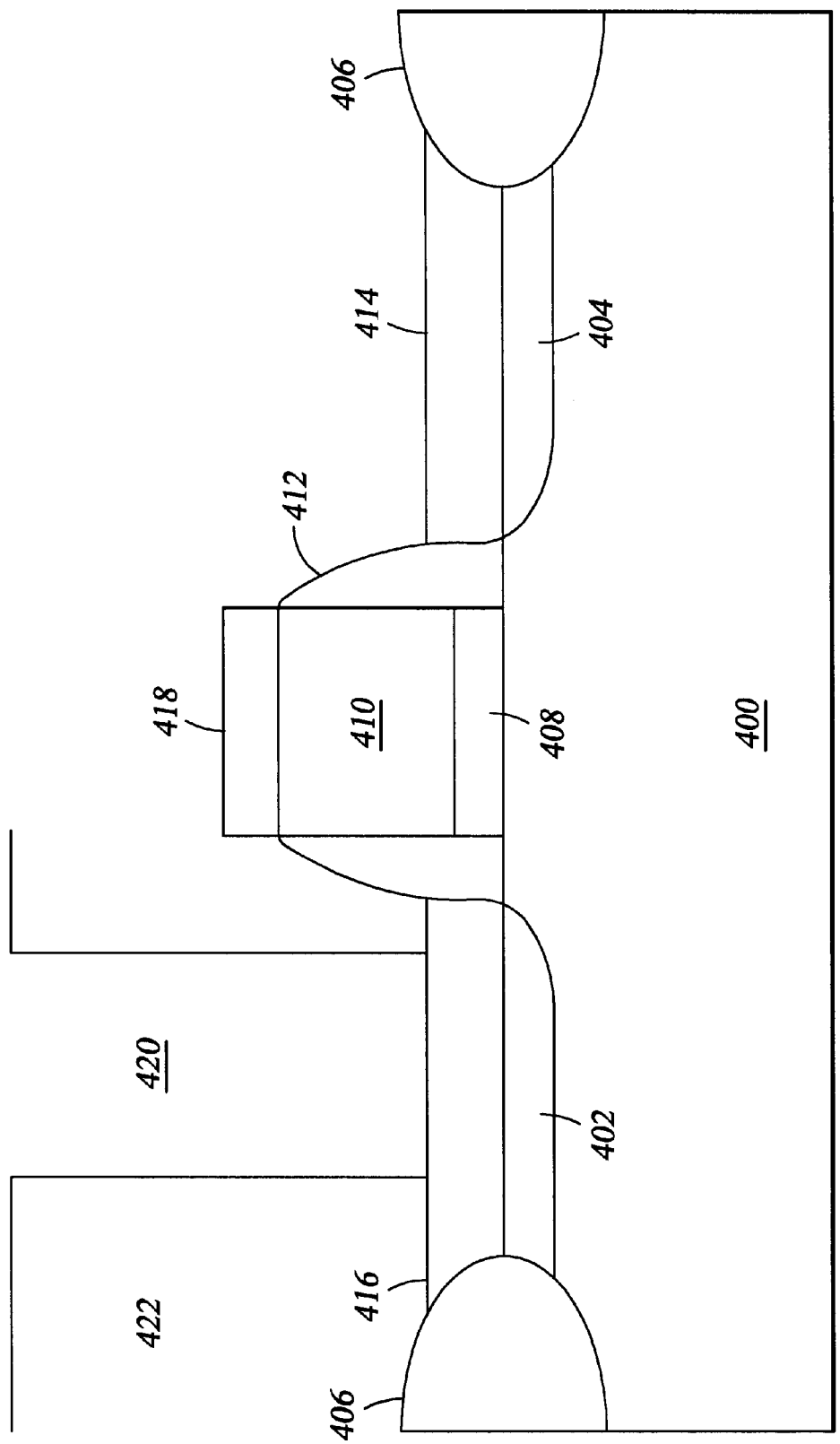
FIG. 9 is a simplified sectional view of a silicide material used as a contact with a transistor.

Another metal silicide application includes the formation of a MOS device shown in FIG. 9. The metal silicide includes silicides of cobalt, titanium, tantalum, tungsten, molybdenum, platinum, nickel, iron, niobium, palladium, and combinations thereof, for use in a MOS device.

In the illustrated MOS structure, N+ source and drain regions 402 and 404 are formed in a P type silicon substrate 400 adjacent field oxide portions 406. A gate oxide layer 408 and a polysilicon gate electrode 410 are formed over silicon substrate 400 in between source and drain regions 402 and 404 with oxide spacers 412 formed on the sidewalls of polysilicon gate electrode 410.

A cobalt layer is deposited over the MOS structure, and in particular over the exposed silicon surfaces of source and drain regions 402 and 404 and the exposed top surface of polysilicon gate electrode 410 by the process described herein. The cobalt material is deposited to a thickness of at about 1000 Å or less to provide a sufficient amount of cobalt for the subsequent reaction with the underlying silicon at 402 and 404. Cobalt may be deposited to a thickness between about 50 Å and about 500 Å on the silicon material. In one aspect, the cobalt layer is then annealed in situ as described herein to form cobalt silicide.

While not shown, a barrier or liner layer of a material, such as titanium nitride, may be deposited on the cobalt material to further enhance the barrier properties of the cobalt layer. The deposition of the titanium nitride layer may replace the step of removing unreacted cobalt as described above. However, the unreacted cobalt and titanium may be removed by the etch process after annealing of the substrate surface according to the anneal processes described herein.

The substrate may then be annealed again according to one of the two-step annealing processes described herein. Dielectric materials 422 may be deposited over the formed structure and etched to provide contact definitions 420 in the device. The contact definitions may then be filled with a contact material, such as tungsten, aluminum, or copper, from chemical vapor deposition techniques, such as described herein.

In one aspect, any unreacted cobalt from the annealing processes may be removed from the substrate surface, typically by a wet etch process or plasma etch process, and the cobalt silicide remains as cobalt suicide ($CoSi_2$) portions 414, 416, and 418 of uniform thickness respectively formed over polysilicon gate electrode 410 and over source and drain regions 402 and 404 in silicon substrate 400. Unreacted cobalt may be removed by an plasma process in a DPS™ chamber located on the same vacuum processing system, or may be transferred to another processing system for processing. Wet etch process are typically performed in a second processing system.

While the foregoing is directed to embodiments of the present invention, other and further embodiments of the invention may be devised without departing from the basic scope thereof, and the scope thereof is determined by the claims that follow.

What is claimed is:

1. A method of processing a substrate, comprising:
   positioning a substrate having a silicon material disposed thereon with patterned feature definitions formed therein in a substrate processing system;
   depositing a first metal layer on the substrate surface in a first processing chamber disposed on the processing system by a physical vapor deposition technique, a chemical vapor deposition technique, or an atomic layer deposition technique;
   forming a metal suicide layer by reacting the silicon material and the first metal layer; and
   depositing a second metal layer on the substrate in a second processing chamber disposed on the processing system by a chemical vapor deposition technique.

2. The method of claim 1, wherein forming the metal silicide layer comprises annealing the substrate in situ prior to transferring the substrate to the second processing chamber.

3. The method of claim 2, wherein forming the metal silicide layer comprises exposing the substrate to a temperature between about 300° C. and about 900° C. prior to depositing the second metal layer in the second processing chamber.

4. The method of claim 2, wherein forming the metal silicide layer comprises depositing the second metal layer by the chemical vapor deposition technique at a temperature between about 300° C. and about 900° C.

5. The method of claim 2, wherein annealing the substrate comprises annealing the substrate in the first processing chamber or a vacuum annealing chamber prior to depositing the second metal layer in the second processing chamber.

6. The method of claim 2, wherein annealing the substrate in situ comprises annealing the substrate at a temperature between about 300° C. and about 900° C. without breaking vacuum.

7. The method of claim 1, wherein forming the metal silicide layer comprises annealing the substrate in situ at a first temperature and annealing the substrate at a second temperature greater than the first temperature without breaking vacuum prior to depositing the second metal layer in the second processing chamber.

8. The method of claim 7, wherein the substrate is etched to remove unreacted metal after the annealing the substrate at a first temperature and prior to the annealing the substrate at a second temperature.

9. The method of claim 7, wherein the first temperature is between about 300° C. and about 600° C. and the second temperature is between about 400° C. and about 900° C.

10. The method of claim 7, wherein the annealing the substrate in situ comprises annealing the substrate at the first temperature in the deposition chamber and annealing the substrate at the second temperature in a vacuum annealing chamber without breaking vacuum in a processing system.

11. The method of claim 7, wherein annealing the substrate in situ comprises annealing the substrate at the first temperature in a first annealing chamber and then annealing the substrate at the second temperature in a second annealing chamber without breaking vacuum in a processing system.

12. The method of claim 1, wherein the first metal layer comprises cobalt, titanium, tantalum, tungsten, molybdenum, platinum, nickel, iron, niobium, palladium, and combinations thereof.

13. The method of claim 1, wherein the first metal layer comprises cobalt, nickel, or combinations thereof and the second metal layer comprises tungsten.

14. The method of claim 1, wherein a layer of barrier material is deposited on the first metal layer prior to depositing the second metal layer.

15. The method of claim 1, further comprising annealing the substrate after depositing the second metal layer.

16. The method of claim 1, further comprising treating the substrate surface to remove oxide formation by a hydrofluoric dipping technique or a plasma etch technique.

17. The method of claim 1,
   wherein the first metal layer comprises cobalt, nickel, or combinations thereof;
   wherein the metal silicide is formed by annealing the substrate at a first temperature;
   wherein the second metal layer comprises tungsten; and
   further comprising annealing the second metal layer at a second temperature greater than the first temperature.

18. The method of claim 17, wherein the second metal layer is deposited at a temperature between about 300° C. and about 500° C.

19. The method of claim 17, wherein the first temperature is between about 300° C. and about 600° C. and the second temperature is between about 400° C. and about 900° C.

20. The method of claim 17, wherein the second metal layer is deposited in a chemical vapor deposition chamber by a process comprising:
   depositing a silicon layer on the first metal layer;
   depositing a tungsten nucleation layer on the silicon layer; and
   depositing bulk tungsten on the tungsten nucleation layer.

21. The method of claim 17, further comprising depositing a titanium nitride layer on the first metal layer prior to depositing the second metal layer.

22. The method of claim 17, wherein the deposition of the metal layer, the annealing at the first temperature, the deposition of the tungsten layer, and the annealing at the second temperature are performed in the same processing system without breaking vacuum.

23. The method of claim 17, wherein the first metal layer comprises cobalt, titanium, tantalum, tungsten, molybdenum, platinum, nickel, iron, niobium, palladium, and combinations thereof.

24. The method of claim 1,
wherein the first metal layer is deposited on the silicon-containing material in the feature definitions in a physical vapor deposition chamber;
wherein the metal silicide layer is formed at an interface of the silicon-containing material and the first metal layer by annealing the substrate in the physical vapor deposition chamber;
wherein the substrate is annealed to substantially convert the first metal layer to metal silicide; and
wherein a second metal layer is a tungsten layer deposited in a chemical vapor deposition chamber.

25. The method of claim 24, wherein the tungsten layer is deposited by a process comprising:
depositing a silicon layer on the first metal layer;
depositing a tungsten nucleation layer on the silicon layer; and
depositing bulk tungsten on the tungsten nucleation layer.

26. The method of claim 24, wherein annealing the substrate in the physical vapor deposition chamber comprises exposing the substrate at a first temperature between about 300° C. and about 600° C.

27. The method of claim 24, wherein annealing the substrate to substantially convert the first metal layer to metal suicide comprises exposing the substrate at a second temperature greater than the first temperature without breaking vacuum prior to depositing the second metal layer, wherein the second temperature is between about 400° C. and about 900° C.

28. The method of claim 24, wherein annealing the substrate to substantially convert the first metal layer to metal silicide comprises exposing the substrate at a second temperature greater than the first temperature after depositing the second metal layer without breaking vacuum, wherein the second temperature is between about 400° C. and about 900° C.

29. The method of claim 24, wherein the substrate is etched to remove unreacted metal after annealing the substrate in situ in the physical vapor deposition chamber to form a metal silicide layer.

30. The method of claim 24, wherein the first metal layer comprises cobalt, titanium, tantalum, tungsten, molybdenum, platinum, nickel, iron, niobium, palladium, and combinations thereof.

31. The method of claim 24, further comprising depositing a barrier layer material on the first metal layer prior to depositing the second metal layer.

32. The method of claim 24, further comprising treating the substrate surface to remove oxide formation by a hydrofluoric dipping technique or a plasma etch technique.

33. The method of claim 1,
wherein the substrate is exposed to a plasma cleaning process in a first processing chamber;
wherein the first metal layer is a cobalt layer deposited on the substrate surface and in the feature definitions by a physical vapor deposition technique in a second processing chamber;
wherein a cobalt silicide layer is partially formed by annealing the substrate at a first temperature in the second processing chamber;
wherein the cobalt silicide layer is substantially formed by annealing the substrate at a second temperature greater than the first temperature in a third processing chamber; and
wherein a tungsten layer is deposited on the cobalt silicide layer by a chemical vapor deposition technique in a fourth processing chamber, wherein the first, second, third, and fourth processing chambers are disposed on one vacuum processing system.

34. The method of claim 33, wherein the first temperature is between about 300° C. and about 600° C. and the second temperature is between about 400° C. and about 900° C.

35. The method of claim 33, wherein the tungsten layer is deposited by an in situ process comprising:
depositing a silicon layer on the metal layer;
depositing a tungsten nucleation layer on the silicon layer; and depositing bulk tungsten on the tungsten nucleation layer.

36. The method of claim 33, further comprising removing unreacted metal after annealing the substrate at a first temperature and prior to annealing the substrate at a second temperature.

37. The method of claim 33, further comprising depositing a layer of barrier material is deposited on the cobalt layer prior to depositing the tungsten layer.

38. The method of claim 33, further comprising treating the substrate surface to remove oxide formation by a hydrofluoric dipping technique or a plasma etch technique.

39. The method of claim 33, further comprising annealing the substrate following deposition of the tungsten layer.

* * * * *

UNITED STATES PATENT AND TRADEMARK OFFICE
CERTIFICATE OF CORRECTION

PATENT NO. : 6,740,585 B2
DATED : May 25, 2004
INVENTOR(S) : Ki Hwan Yoon et al.

It is certified that error appears in the above-identified patent and that said Letters Patent is hereby corrected as shown below:

Column 2,
Line 64, change "manufactures" to -- manufacturers --.

Column 4,
Line 21, change "sucide" to -- silicide --.

Column 5,
Line 6, delete "is".

Column 6,
Line 41, delete "a".

Column 7,
Line 37, change "an" to -- a --.
Line 55, change "142" to -- 172 --.

Column 10,
Line 4, change "294" to -- 292 --.

Column 12,
Line 14, delete "for".
Line 24, delete the second occurrence of "such as".
Line 48, add "be" after "may.

Column 13,
Line 39, change "110" to -- 154 --.

Column 14,
Line 6, change "RE" to -- RF --.

Column 16,
Line 33, change "300" to -- 30 --.

Column 18,
Line 35, change "suicide" to -- silicide --.

UNITED STATES PATENT AND TRADEMARK OFFICE
CERTIFICATE OF CORRECTION

PATENT NO. : 6,740,585 B2
DATED : May 25, 2004
INVENTOR(S) : Ki Hwan Yoon et al.

It is certified that error appears in the above-identified patent and that said Letters Patent is hereby corrected as shown below:

Column 20,
Line 8, delete "the".

Column 21,
Lines 22 and 46, change "suicide" to -- silicide --.

Column 23,
Line 35, change "suicide" to -- silicide --.

Signed and Sealed this

Twenty-eighth Day of December, 2004

JON W. DUDAS
*Director of the United States Patent and Trademark Office*